(12) United States Patent
Kim

(10) Patent No.: US 7,154,791 B2
(45) Date of Patent: Dec. 26, 2006

(54) REDUNDANCY CIRCUIT

(75) Inventor: Byoung-Sul Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/867,491

(22) Filed: Jun. 14, 2004

(65) Prior Publication Data

US 2005/0041492 A1    Feb. 24, 2005

(30) Foreign Application Priority Data

Aug. 7, 2003    (KR) .................... 10-2003-0054662

(51) Int. Cl.
*G11C 7/00* (2006.01)

(52) U.S. Cl. ............... 365/200; 365/225.7; 365/189.07

(58) Field of Classification Search ................ 365/200
See application file for complete search history.

(56) References Cited

U.S. PATENT DOCUMENTS

| | | | | |
|---|---|---|---|---|
| 6,094,382 A | * | 7/2000 | Choi et al. | 365/200 |
| 6,097,645 A | * | 8/2000 | Penney et al. | 365/200 |
| 6,118,712 A | * | 9/2000 | Park et al. | 365/200 |
| 6,426,901 B1 | * | 7/2002 | Wada | 365/200 |
| 6,536,002 B1 | * | 3/2003 | Kim | 714/710 |
| 6,538,934 B1 | * | 3/2003 | Sakata | 365/200 |
| 6,707,730 B1 | * | 3/2004 | Mori et al. | 365/200 |

\* cited by examiner

Primary Examiner—Thong Q. Le
(74) Attorney, Agent, or Firm—F. Chau & Associates, LLC

(57) ABSTRACT

A redundancy circuit for use with a semiconductor memory device is provided. The redundancy circuit includes input address buffers for storing input address bits; fuse boxes for storing repair address bits; a comparator for comparing the input address bits stored in the input address buffers with the repair address bits stored in the fuse boxes; and a redundancy enable determiner for determining whether a redundant memory cell is to be applied to the memory device according to a comparison result of the comparator.

16 Claims, 6 Drawing Sheets a. First type fuse box structure b. Second type fuse box structure

REDUNDANCY CIRCUIT

BACKGROUND OF THE INVENTION

1. Technical Field

The present invention relates to a semiconductor memory device, and more particularly, to a redundancy circuit for use with the semiconductor memory device.

2. Discussion of the Related Art

Improving the yield of a semiconductor memory device is typically an important matter that should be considered when manufacturing the semiconductor memory device. Generally, if a semiconductor memory device has one or a few defective memory cells, it cannot be shipped as a product for use in the marketplace. In some fields, however, such as those that utilize an automated response function, devices manufactured for use therein, such as a dynamic random access memory (DRAM), a static random access memory (SRAM) and an electrically erasable and programmable read only memory (EEPROM) that have defective memory cells, may still be used in the marketplace.

The probability that a defective memory cell will be generated when a high density semiconductor memory device is manufactured is greater than that of when a low density semiconductor memory device is manufactured. This typically occurs, as the higher density semiconductor memory device is affected by difficulties such as debris, during the manufacturing process. Because the semiconductor memory device is affected by debris, the yield is lowered further. Therefore, various attempts have been made to increase the yield of a high density semiconductor memory device.

To obtain a high yield semiconductor memory device, defective memory cells that may be generated when manufacturing the semiconductor memory device should be suppressed. However, current efforts employed to suppress the generation of defective memory cells have certain limitations. Accordingly, additional techniques for improving the yield have been suggested. One such technique is to save the defective areas or cells that are generated during the manufacturing process of a semiconductor memory device by modifying the construction of the semiconductor memory device.

A redundancy technique is typically used to save the defective areas or cells generated during the manufacture of a semiconductor memory device. According to the redundancy technique, a memory device, for use therein, includes a main memory cell array for storing binary data and redundant (or spare) memory cell arrays organized in rows and columns. If a few or thousands of defective memory cells are found during a test procedure performed on the main memory cell, the defective memory cells are replaced with redundant memory cells, and the semiconductor memory device is regarded as non-defective. If the number of the defective memory cells exceeds the number of the allocated redundant memory cells, the semiconductor memory device is generally discarded because it cannot be repaired.

Usually, the redundant memory cell array that is used to substitute for defective memory cells that exist on rows of the main memory cell array is called a row redundancy array. The redundant memory cell array that is used to substitute for defective memory cells that exist on columns of the main memory cell array is called a column redundancy array. In order to substitute the redundant memory cells for the defective memory cells, a circuit for storing repair addresses and a circuit for determining whether an address inputted from the outside is identical to the repair addresses are required. These circuits are typically called redundancy circuits. A row redundancy circuit decodes an arbitrary row address, and replaces a defective row area with a corresponding row area of the redundant memory cell array when the decoded row address is identical to any one of the repair addresses. Similar to the row redundancy circuit described above, a column redundancy circuit compares the column address with the stored repair addresses, and replaces defective column areas of the main memory cell array with a corresponding column area of the redundant memory cell array.

In typical redundancy techniques, the circuits for storing repair addresses should have non-volatile memory characteristics. These redundancy techniques include a technique for using a fuse circuit (known as a "program circuit" because fuses are selectively blown out to program (store) repair addresses therein) having a plurality of fuses made of metal, polysilicon, etc. for storing repair row addresses, and a technique for using a nonvolatile memory such as a PROM, EPROM, EEPROM, etc. as a circuit for storing repair row addresses. Of the two techniques, the technique for using the fuse circuit as the circuit for storing repair row addresses has been widely used.

FIG. 1 is a block diagram of a conventional redundancy structure 100. Referring to FIG. 1, when an external address is inputted to a semiconductor memory device embodying, for example, the convention redundancy structure 100, the external address is decoded by a pre-decoder 110 and inputted to a main decoder 120 and a redundancy circuit 130. The external address decoded by the redundancy circuit 130 is then checked. If the external address is identical to a stored repair address, a disable signal is sent to the main decoder 120 and a redundancy enable signal is generated to select a redundant memory cell array 150 instead of a normal memory cell array 140.

FIG. 2 illustrates a conventional redundancy circuit 200. Referring to FIG. 2, the conventional redundancy circuit 200 includes a master fuse circuit M10, address fuse boxes AF1, AF2, and AF3, and an AND gate AND1. The address fuse box AF1 receives eight signals 1–8 obtained by pre-decoding a 3-bit external address DRA2–DRA4 and stores a repair address by blowing out a fuse. The address fuse box AF2 receives four signals 9–12 obtained by pre-decoding a 2-bit external address DRA5–DRA6 and stores a repair address by blowing out a fuse. The address fuse box AF3 receives four signals 13–16 obtained by pre-decoding a 2-bit external address DRA7–DRA8 and stores a repair address by blowing out a fuse. The AND gate AND1 receives outputs of the address fuse boxes AF1–AF3, and outputs a redundancy enable signal RED.

The address fuse boxes AF1–AF3 include a plurality of transistors and fuses F1–F16. Each of the transistors receives an output of the master fuse circuit M10 at a gate thereof. The fuses F1–F16 are each connected to one of the plurality of transistors.

The master fuse circuit M10 determines whether the redundancy circuit 200 is to be used and if the redundancy circuit 200 is used, it determines whether the repair address stored in the fuse boxes AF1–AF3 is identical to the inputted address. If the stored repair address is identical to the inputted address, a redundant memory cell of the redundant memory cell array 150 is accessed.

In the conventional redundancy circuit 200, when an n-bit address is used, $2^n$ fuses are required to store information on the repair address. This is so because an address is stored by connecting the fuses to the 2ⁿ signals, which are obtained by decoding an n-bit address, when storing a repair address in an address fuse box.

Thus, as described above, the number of the fuses required for the conventional redundancy circuit 200 dramatically increases as the number of the address bits increases resulting in the reduction of fuse pitch as the number of fuses in fuse boxes having the same size increases.

FIG. 3 illustrates a fuse pitch and the size of a spot for melting a fuse. Referring to FIG. 3, when the number of the fuses in the same area increases and the fuse pitch is reduced, the size of the spot used by repair equipment for melting a fuse should also be reduced. However, efforts to reduce the size of the spot used by the repair equipment have certain limitations. Accordingly, a fuse box structure where spots are focused in two lines is employed to increase the number of fuses without reducing the fuse pitch.

FIG. 4 illustrates structures of a first type fuse box, in which spots are focused in a line, and a second type fuse box, in which spots are focused in two lines. As shown in FIG. 4, the fist type fuse box structure allows more fuses to be formed in the same area without reducing the fuse pitch in comparison with the second type fuse box structure. The second type fuse box structure requires a long fuse resulting in an increased size of the semiconductor memory device.

When the fuses are cut, all the fuses of the first type fuse box are cut only by moving a cutting machine once, for example, in a forward direction, but all the fuses of the second type fuse box can be cut by moving a cutting machine twice, for example, in the forward direction and a rearward direction as shown in FIG. 4. Thus, both fuse box structures take a long time to cut and repair.

SUMMARY OF THE INVENTION

In one embodiment of the present invention, there is provided a redundancy circuit for use with a memory device that comprises: input address buffers for storing input address bits; fuse boxes for storing repair address bits; a comparator for comparing the input address bits stored in the input address buffers with the repair address bits stored in the fuse boxes; and a redundancy enable determiner for determining whether a redundant memory cell is to be applied to the memory device according to a comparison result of the comparator.

The input address bits stored in the input address buffers and the repair address bits stored in the fuse boxes are external address bits that were not decoded by a decoder. A first fuse box of the fuse boxes stores a logic high value when a fuse in the first fuse box is cut and the first fuse box stores a logic low value when the fuse in the first box is not cut. The fuse boxes comprise: a fuse; a positive channel metal oxide semiconductor (PMOS) transistor having a drain connected to a first end of the fuse and a source connected to a power supply voltage; and a negative channel metal oxide semiconductor (NMOS) transistor having a drain connected to a second end of the fuse and a source connected to a ground voltage. The comparator is an exclusive NOR logic gate configured to receive an output of the fuse boxes and an output of the input address buffer. The redundancy enable determiner is an AND logic gate configured to receive an output of the comparator.

In another embodiment of the present invention, a redundancy circuit for use with a semiconductor memory device comprises: a plurality of address buffers for receiving and storing external address bits; a plurality of address fuse boxes for storing repair address bits; a comparator for receiving the external address bits from the plurality of address buffers and the repair address bits from the plurality of address fuse boxes for comparing the external address bits with the repair address bits; a redundancy enable determiner for receiving an output of the comparator and for determining whether to enable a redundant memory cell of a redundant memory cell array; and a fuse circuit for determining whether to use the redundancy circuit.

The external address bits and the repair address bits are not decoded by a decoder. Each of the plurality of address fuse boxes comprises: an NMOS transistor having a gate connected to an output of the fuse circuit, a source connected to a ground voltage and a drain connected to a first end of a fuse; and a PMOS transistor having a source connected to a power supply voltage and a drain connected to a second end of the fuse.

The comparator comprises: a plurality of exclusive NOR logic gates, wherein the exclusive NOR logic gates receive outputs from the plurality of address fuse boxes associated with the repair address bits stored in the plurality of address fuse boxes and the external address bits stored in the plurality of address buffers, and outputs a logic high signal to the redundancy enable determiner when the outputs of the address fuse boxes are the same as the external address.

The redundancy enable determiner comprises: an AND logic gate, wherein the redundancy enable determiner outputs a redundancy enable signal when an output of the fuse circuit is at a high logic level and the output of the comparator is at a high logic level. The redundancy circuit applies the redundant memory cell to the semiconductor memory device. The fuse circuit comprises: a first fuse having a first end connected to a first power supply voltage and a second end connected to a source of a PMOS transistor; a second fuse having a first end connected to a drain of the PMOS transistor and a second end connected to a drain of an NMOS transistor, wherein the NMOS transistor has a source connected to the ground voltage and a gate connected to a second power supply voltage; and an inverter connected between the second fuse and the drain of the PMOS transistor, wherein the inverter receives a signal from the drain of the PMOS transistor and outputs the signal to the plurality of address fuse boxes, wherein the signal is used to determine whether to use the redundancy circuit.

In yet another embodiment of the present invention, a system for applying redundant memory cells to a semiconductor memory device comprises: a pre-decoder for directly receiving and decoding an external address; and a redundancy circuit for directly receiving the external address, wherein the redundancy circuit applies a redundant memory cell of a redundant memory cell array to the semiconductor memory device when the directly received external address is the same as a repair address stored in the redundancy circuit. When the directly received external address is not the same as the repair address stored in the redundancy circuit, a normal memory cell of a normal memory cell array is applied to the semiconductor memory device.

The foregoing features are of representative embodiments and are presented to assist in understanding the invention.

BRIEF DESCRIPTION OF THE DRAWINGS

The features of the present invention will become more apparent by describing in detail exemplary embodiments thereof with reference to the attached drawings, in which.

DETAILED DESCRIPTION OF EXEMPLARY EMBODIMENTS

Figure 5:
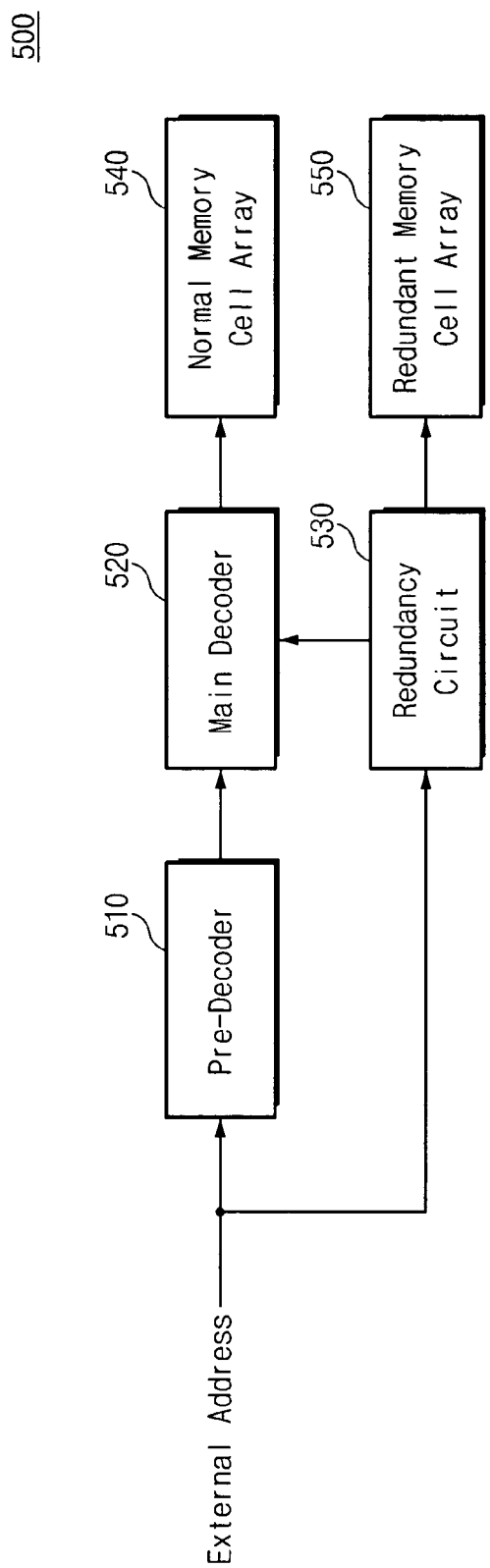
FIG. 5 is a block diagram of a redundancy structure according to an exemplary embodiment of the present invention.
Figure 6:
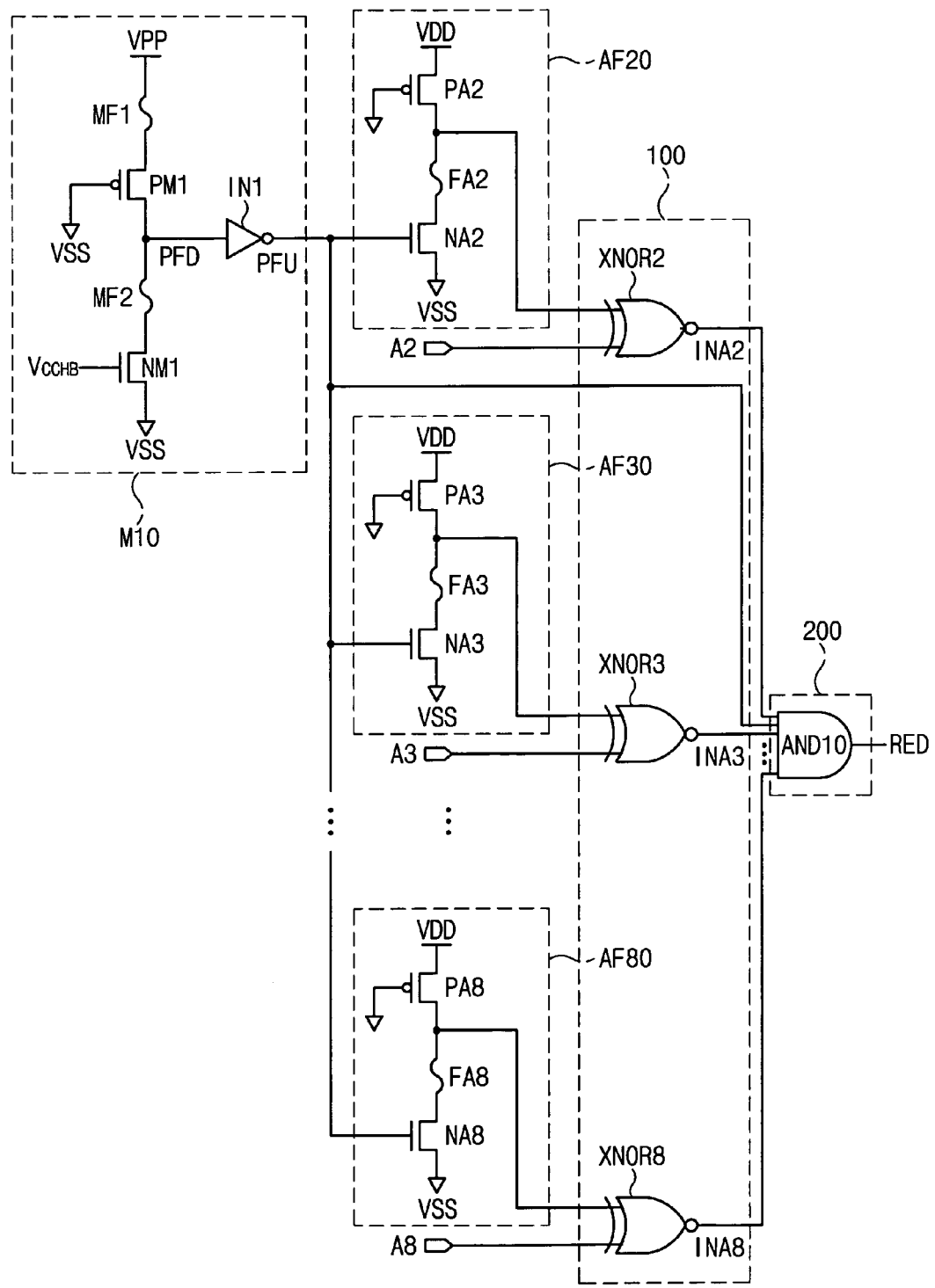
FIG. 6 illustrates a redundancy circuit according to an exemplary embodiment of the present invention.

FIG. 5 is a block diagram of a redundancy structure 500 according to an exemplary embodiment of the present invention, and FIG. 6 illustrates a redundancy circuit 600 according to an exemplary embodiment of the present invention.

Figure 1:
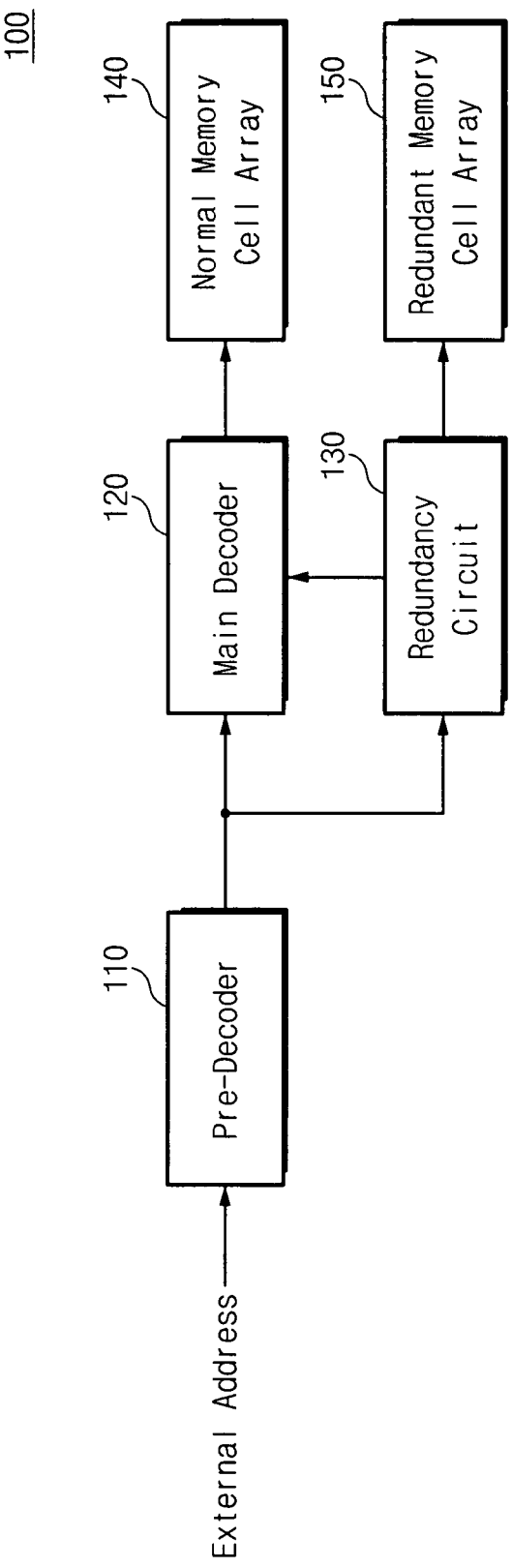
FIG. 1 is a block diagram of a conventional redundancy structure.
Figure 2:
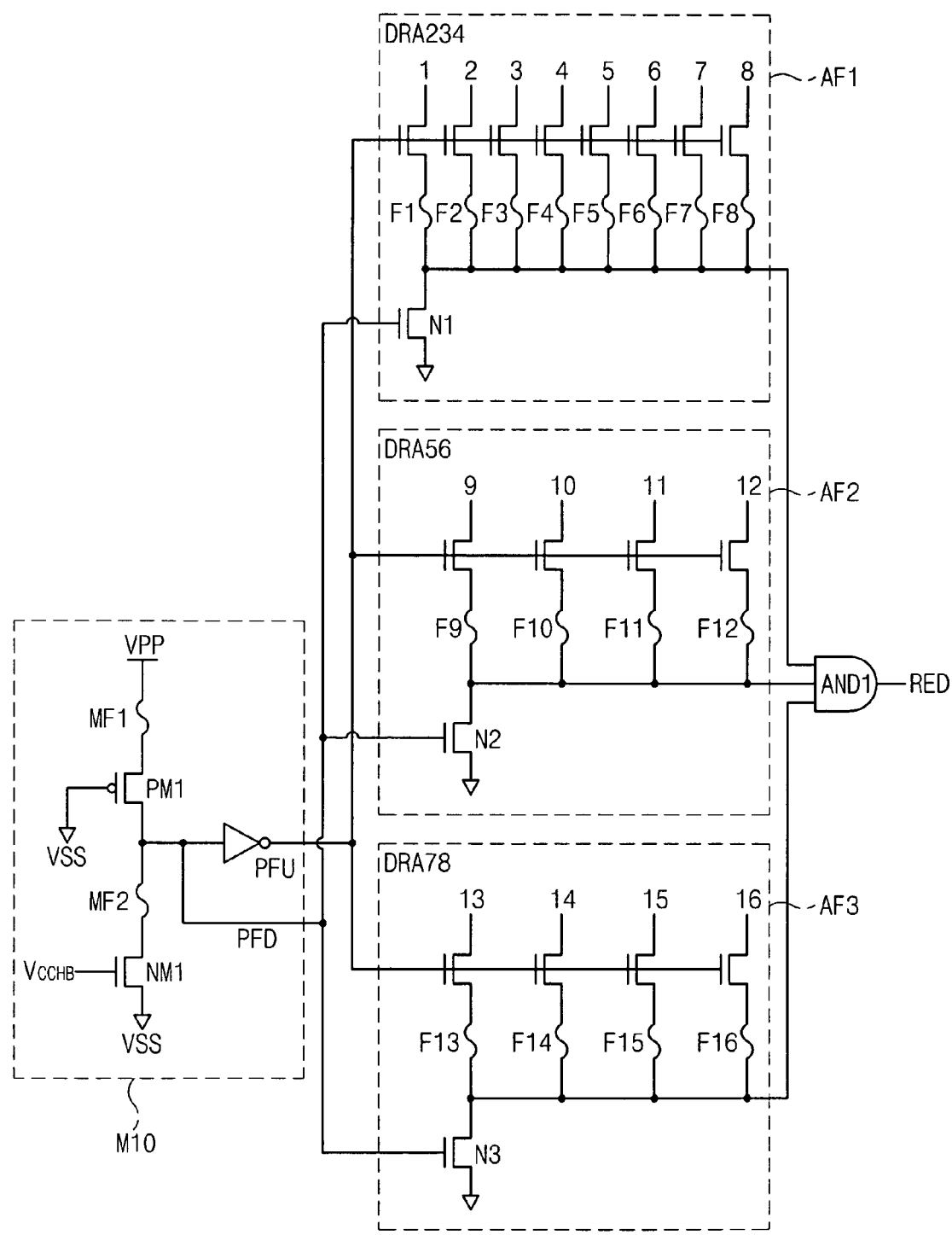
FIG. 2 illustrates a conventional redundancy circuit.
Figure 3:
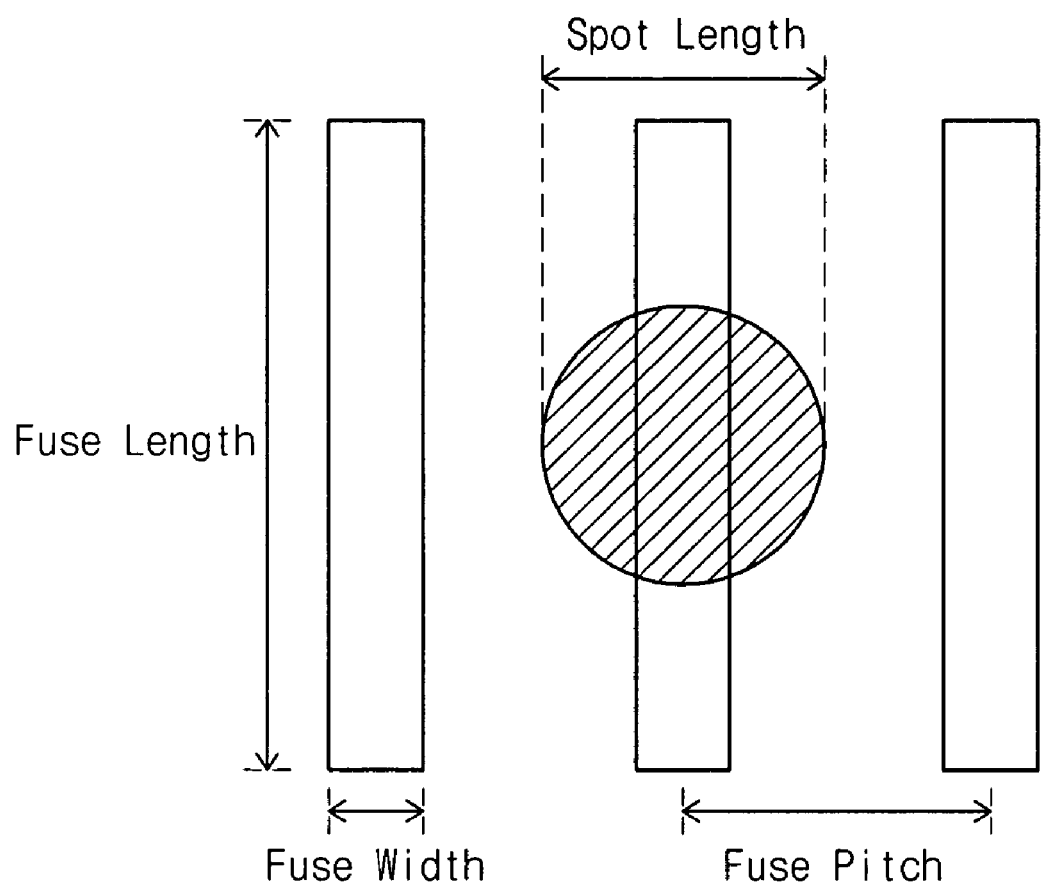
FIG. 3 illustrates a fuse pitch and the size of a spot for melting a fuse.
Figure 4:
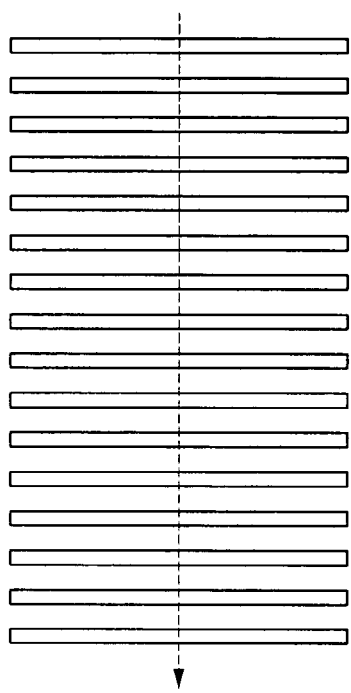
FIG. 4 illustrates structures of a first type fuse box and a second type fuse box.
Figure 4:
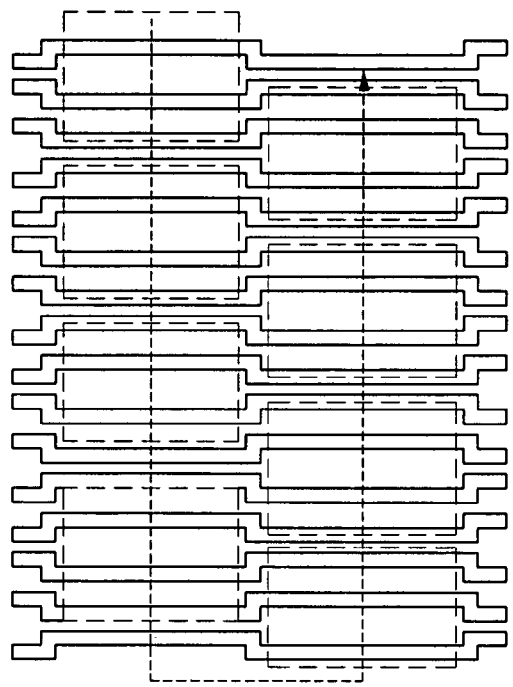

Referring to FIG. 5, in contrast to the conventional redundancy structure 100 of FIG. 1, external addresses are inputted directly to a redundancy circuit 530. In other words, external addresses that are not decoded by a pre-decoder 510 are inputted to the redundancy circuit 530. A repair address stored in the redundancy circuit 530 is not a decoded signal rather it is an external address not decoded by the pre-decoder 510.

FIG. 6 illustrates an exemplary embodiment of the redundancy circuit 600 for receiving seven external address bits A2, A3 . . . A8 of an external address, via a plurality of input address buffers, and for determining whether the seven-bit external address A2, A3 . . . A8 is identical to a repair address.

Referring to FIG. 6, the redundancy circuit 600 includes a master fuse circuit M10, address fuse boxes AF20, AF30 . . . AF80, a comparator 100, and a redundancy enable determiner 200. The master fuse circuit M10 determines whether the redundancy circuit 600 is to be used, for example, to access a redundant memory cell of a redundant memory cell array 550. The address fuse boxes AF20, AF30 . . . AF80 store repair addresses. The comparator 100 compares the external address A2, A3 . . . A8 with the repair addresses stored in the address fuse boxes AF20, AF30 . . . AF80. The redundancy enable determiner 200 receives outputs of the comparator 100 and determines whether a redundant memory cell of the redundant memory cell array 550 is to be used.

The master fuse circuit M10 includes a first master fuse MF1, a positive channel metal oxide semiconductor (PMOS) transistor PM1, a second master fuse MF2, a negative channel metal oxide semiconductor (NMOS) transistor NM1, and an inverter IN1.

The first master fuse MF1 has one end connected to a power supply voltage Vpp. The PMOS transistor PM1 has a source connected to the other end of the first master fuse MF1. The second master fuse MF2 has one end connected to a drain PFD of the PMOS transistor PM1. The NMOS transistor NM1 has a drain connected to the other end of the second master fuse MF2. The inverter IN1 receives a signal from the drain PFD of the PMOS transistor PM1.

If the first master fuse MF1 is cut and the second master fuse MF2 is not cut, when a power supply voltage VCCHB is applied, the NMOS transistor NM1 is turned on. The drain PFD of the PMOS transistor PM1 is grounded and the output PFU of the master fuse circuit M10 becomes logically high. In this case, if an external input address is identical to the address of one of the address fuse boxes (e.g., AF20), an AND gate AND10 of the redundancy enable determiner 200 outputs a logic high signal, that is, a redundancy enable signal RED, which enables a redundant memory cell from the redundant memory cell array 550 to be accessed.

If the first master fuse MF1 is connected and the second master fuse MF2 is cut, the drain PFD of the PMOS transistor PM1 becomes logically high. This causes the output PFU of the master fuse circuit M10 to become logically low. In this case, although an external input address is identical to the address of one of the address fuse boxes (e.g., AF20), the AND gate AND10 of the redundancy enable determiner 200 outputs a logic low signal, and a redundant memory cell, from the redundant memory cell array 550, is not accessed.

The address fuse box AF20 includes an NMOS transistor NA2, a fuse FA2 and a PMOS transistor PA2. The NMOS transistor NA2 has a gate connected to an output terminal PFU of the inverter IN1 of the master fuse circuit M10. The fuse FA2 has one end connected to a drain of the NMOS transistor NA2. The PMOS transistor PA2 has a drain connected to the other end of the fuse FA2 and a source connected to power supply voltage Vdd. The remaining fuse boxes AF30 . . . AF80 have the same or similar structure as that of the address fuse box AF20.

The address fuse boxes AF30 . . . AF80 store complementary values according to whether the fuses therein are cut or not. In other words, if a fuse of the fuse boxes AF30 . . . AF80 is cut, the address fuse boxes AF30 . . . AF80, where the fuse was cut, store a logic high value "1", respectively. If the fuses of the fuse boxes AF30 . . . AF80 are not cut, the address fuse boxes AF30 . . . AF80 store a logic low value "0", respectively. In this way, repair addresses are stored.

The comparator 100 includes exclusive NOR logic gates XNOR2, XNOR3 . . . XNOR8. The exclusive NOR logic gate XNOR2 receives the output of the address fuse box AF20 and an external address bit A2 via one of the plurality of input address buffers. Each of the remaining exclusive NOR logic gates XNOR3 . . . XNOR8 also receives the output of their corresponding address fuse boxes and external address bits.

Because the comparator 100 includes the exclusive NOR gates XNOR2, XNOR3 . . . XNOR8, the comparator 100 outputs a logic high signal only when the output of the address fuse boxes AF20, AF30 . . . AF80 is identical to an inputted external address.

When all the outputs of the comparator 100 are logically high, in other words, when the external address bits A2, A3 . . . A4 inputted to the comparator 100 are identical to the outputs of the address fuse boxes AF20, AF30 . . . AF80 inputted to the comparator, the AND gate AND 10 outputs a logic high signal, that is, a redundancy enable signal RED. When the redundancy enable signal RED is outputted, the AND gate AND10 accesses a redundant memory cell, from the redundant memory cell array 550, corresponding to the external address.

The redundancy circuit 600 operates as follows. First, the master fuse circuit M10 determines whether the redundancy circuit 600 is to be used. The fuse FA2 of, for example, the address box AF20 is cut or connected according to the repair address. If the fuse FA2 is cut, the address box AF20 outputs a logic high signal. If the fuse FA2 is connected, the address box AF20 outputs a logic low signal.

If an external address of A2 is inputted and a power supply voltage VCCHB is applied, the NMOS transistor NM1 is turned on. The exclusive NOR gate XNOR2 then compares the value stored in the address fuse box AF20 with an inputted external address A2. When the output of the address fuse box AF20 is identical to the external address A2, in other words, when both of them are logically high or low, the exclusive NOR gate XNOR2 outputs a signal INA2 that is logically high.

A logic table for signals of the address fuse box AF20 and the exclusive NOR gate XNOR2 is as follows.

TABLE 1

| PFU | A2 | FA2 | INA2 | RED |
|---|---|---|---|---|
| 0 | X | X | X | 0 |
| 1 | 0 | 0 | 1 | 1 |
| 1 | 0 | 1 | 0 | 0 |
| 1 | 1 | 0 | 0 | 0 |
| 1 | 1 | 1 | 1 | 1 |

The remaining address fuse boxes AF30 . . . AF80 and the exclusive NOR gates XNOR3 . . . XNOR8 operate in the same or similar fashion as the address fuse box F2 and the exclusive NOR gate XNOR2.

Accordingly, the redundancy enable determiner 200 via the AND gate AND10 outputs a redundancy enable signal RED having a logic high level only when the output PFU of the master fuse circuit M10 is maintained at a high logic level, and when the outputs of the exclusive NOR gates XNOR2, XNOR3 . . . XNOR8 are logically high. In other words, when all the outputs of the address fuse boxes AF20, AF30 . . . AF80 are identical to the external address bits A2, A3 . . . A8 the redundancy enable signal RED having a logic high level is output.

According to the present invention, a pitch limitation that results as the integration density in a semiconductor memory device increases, is overcome because the number of fuses in a fuse box can be dramatically reduced for repairing the same external address.

In addition, a redundancy circuit for reducing the number of the fuses is configured, so that the first type fuse box structure is used instead of the second type fuse box structure that causes the semiconductor memory device's chip size and repair time to increase. In other words, the first type fuse box structure is used so that the chip size of the semiconductor memory device and repair time can be decreased. In addition, the redundancy capabilities can be further increased due to the reduction of the number of the fuses, thus improving repair efficiency and productivity.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A redundancy circuit for use with a memory device, comprising:
    input address buffers for storing input address bits;
    fuse boxes for storing repair address bits;
    a comparator for comparing the input address bits stored in the input address buffers with the repair address bits stored in the fuse boxes; and
    a redundancy enable determiner for receiving a comparison result of the comparator and an output of a fuse circuit and determining whether a redundant memory cell is to be applied to the memory device according to the comparison result of the comparator and the output of the fuse circuit,
    wherein the redundancy enable determiner is a logic gate performing an AND function.

2. The redundancy circuit of claim 1, wherein the input address bits stored in the input address buffers and the repair address bits stored in the fuse boxes are external address bits that were not decoded by a decoder.

3. The redundancy circuit of claim 2, wherein a first fuse box of the fuse boxes stores a logic high value when a fuse in the first fuse box is cut and the first fuse box stores a logic low value when the fuse in the first fuse box is not cut.

4. The redundancy circuit of claim 2, wherein each of the fuse boxes comprises:
    a fuse;
    a positive channel metal oxide semiconductor (PMOS) transistor having a drain connected to a first end of the fuse and a source connected to a power supply voltage; and
    a negative channel metal oxide semiconductor (NMOS) transistor having a drain connected to a second end of the fuse and a source connected to a ground voltage.

5. The redundancy circuit of claim 2, wherein the comparator is a logic circuit configured to receive an output of one of the fuse boxes and an output of one of the input address buffers.

6. The redundancy circuit of claim 5, wherein the logic circuit is an exclusive NOR logic gate.

7. A redundancy circuit for use with a semiconductor memory device, comprising:
    a plurality of address buffers for receiving and storing external address bits;
    a plurality of address fuse boxes for storing repair address bits;
    a comparator for receiving the external address bits from the plurality of address buffers and the repair address bits from the plurality of address fuse boxes for comparing the external address bits with the repair address bits;
    a fuse circuit for determining whether to access a redundant memory cell of a redundant memory cell array; and
    a redundancy enable determiner for receiving an output of the comparator and an output of the fuse circuit and for determining whether to use the redundant memory cell of the redundant memory cell array according to the output of the comparator and the output of the fuse circuit,
    wherein the redundancy enable determiner comprises a logic gate performing an AND function.

8. The redundancy circuit of claim 7, wherein the external address bits and the repair address bits are not decoded by a decoder.

9. The redundancy circuit of claim 7, wherein each of the plurality of address fuse boxes comprises:
    a negative channel metal oxide semiconductor (NMOS) transistor having a gate connected to the output of the fuse circuit, a source connected to a ground voltage and a drain connected to a first end of a fuse; and
    a positive channel metal oxide semiconductor (PMOS) transistor having a source connected to a power supply voltage and a drain connected to a second end of the fuse.

10. The redundancy circuit of claim 7, wherein the comparator comprises:
    a plurality of exclusive NOR logic gates, wherein the exclusive NOR logic gates receive outputs from the plurality of address fuse boxes associated with the repair address bits stored in the plurality of address fuse boxes and the external address bits stored in the plurality of address buffers, and outputs a logic high signal to the redundancy enable determiner when the outputs of the address fuse boxes are the same as the external address.

11. The redundancy circuit of claim 7,
wherein the redundancy enable determiner outputs a redundancy enable signal when an output of the fuse circuit is at a high logic level and the output of the comparator is at a high logic level.

12. The redundancy circuit of claim 7, wherein the redundancy circuit applies the redundant memory cell to the semiconductor memory device.

13. The redundancy circuit of claim 7, wherein the fuse circuit comprises:
a first fuse having a first end connected to a first power supply voltage and a second end connected to a source of a PMOS transistor;
a second fuse having a first end connected to a drain of the PMOS transistor and a second end connected to a drain of an NMOS transistor, wherein the NMOS transistor has a source connected to the ground voltage and a gate connected to a second power supply voltage; and
an inverter connected between the second fuse and the drain of the PMOS transistor, wherein the inverter receives a signal from the drain of the PMOS transistor and outputs the signal to the plurality of address fuse boxes and the redundancy enable determiner, wherein the signal is used to determine whether to use the redundancy circuit.

14. A system for applying redundant memory cells to a semiconductor memory device, comprising:
a pre-decoder for directly receiving and decoding an external address; and
a redundancy circuit for directly receiving the external address that is not decoded by the pre-decoder, wherein the redundancy circuit applies a redundant memory cell of a redundant memory cell array to the semiconductor memory device when the directly received external address is the same as a repair address stored in the redundancy circuit,
wherein the redundancy circuit comprises a fuse circuit for determining whether to access the redundant memory cell of the redundant memory cell array.

15. The system of claim 14, wherein when the directly received external address is not the same as the repair address stored in the redundancy circuit, a normal memory cell of a normal memory cell array is applied to the semiconductor memory device.

16. A redundancy circuit for use with a semiconductor memory device, comprising:
a plurality of address buffers for receiving and storing external address bits;
a plurality of address fuse boxes for storing repair address bits;
a comparator for receiving the external address bits from the plurality of address buffers and the repair address bits from the plurality of address fuse boxes for comparing the external address bits with the repair address bits;
a fuse circuit for determining whether to access a redundant memory cell of a redundant memory cell array; and
a redundancy enable determiner for receiving an output of the comparator and an output of the fuse circuit and for determining whether to use the redundant memory cell of the redundant memory cell array according to the output of the comparator and the output of the fuse circuit, wherein the fuse circuit comprises:
a first fuse having a first end connected to a first power supply voltage and a second end connected to a source of a PMOS transistor;
a second fuse having a first end connected to a drain of the PMOS transistor and a second end connected to a drain of an NMOS transistor, wherein the NMOS transistor has a source connected to the ground voltage and a gate connected to a second power supply voltage; and
an inverter connected between the second fuse and the drain of the PMOS transistor, wherein the inverter receives a signal from the drain of the PMOS transistor and outputs the signal to the plurality of address fuse boxes and the redundancy enable determiner, wherein the signal is used to determine whether to use the redundancy circuit.

* * * * *